United States Patent [19]
Byers

[11] Patent Number: 6,157,308
[45] Date of Patent: Dec. 5, 2000

[54] DETECTING HIDDEN FAULTS IN RELIABLE POWER SYSTEMS

[75] Inventor: Charles Calvin Byers, Aurora, Ill.

[73] Assignee: Lucent Technologies Inc., Murray Hill, N.J.

[21] Appl. No.: 09/329,687

[22] Filed: Jun. 10, 1999

[51] Int. Cl.[7] .................................................. G08B 21/00
[52] U.S. Cl. ......................... 340/635; 340/650; 340/651; 340/652; 340/660; 340/661; 324/512; 324/522; 324/523
[58] Field of Search ..................................... 340/635, 645, 340/650, 651, 652, 660, 661; 324/512, 522, 523

[56] References Cited

U.S. PATENT DOCUMENTS 3,679,970  7/1972  Winters et al. ........................... 324/51
4,346,347  8/1982  Kamata et al. ........................ 324/128 D

*Primary Examiner*—Julie Lieu
*Attorney, Agent, or Firm*—Werner Ulrich

[57] ABSTRACT

A method and apparatus for detecting silent faults in feeding diodes of redundant DC power supplies. The voltages on both sides of the feeding diodes are measured. Arrangements are then made to ensure that if corresponding feeding diodes are both operative, that current flows through a particular one of these diodes. The measurements of voltage under the various conditions will reveal any open or shorted feeding diodes. The voltage across a diode can be altered by heating the diode through the process of heating a power resistor that is in thermal contact with that diode. Alternatively, a controllable rectifier of a power source can be controlled to reduce the voltage of that power source, and thereby drive current through the diode connected to the other power source. Advantageously, this arrangement allows silent faults in these diodes to be detected without substantial risk of causing the failure in the powered system.

2 Claims, 2 Drawing Sheets

DETECTING HIDDEN FAULTS IN RELIABLE POWER SYSTEMS

TECHNICAL FIELD

This invention relates to fault detection in reliable power supply systems, and more specifically, to detection of faults in redundantly powered reliable DC power systems.

Problem

FIG. 1 is a diagram of a typical reliable power supply of the prior art. For reliability two Battery Plants, 1 and 2, are provided. Both of these feed a Power Converter 30 on a Printed Circuit (PC) Board 32. The Power Converter drives a plurality of units represented as Load 34. In order to allow either battery plant to drive the power converter, a first pair of Diodes 11 and 12, connected between the positive terminal of the two battery plants, and a positive input to Power converter 30, and a second pair of Diodes 21 and 22, connected between the negative side of the two battery plants, and the negative input to the Power Converter 30 are provided. These diodes serve to isolate the two battery plants, and allow the system to continue operating if either battery plant fails. They also act to isolate the two plants, so that one operative battery plant does not try to drive outside loads connected to a failed battery plant by routing power through PC Board 32.

Battery plants typically used in telecommunications or computer systems have two power feeds, (+ and −, or feed and return), to avoid ground loops, reduce common mode power supply noise, and improve immunity to transients such as lightning strikes. Effectively, each pair of diodes, "OR's" the battery plants to the power converter so that if either battery plant is operative, the power converter can continue to function.

A problem of the prior art is the presence of "silent failures". If any of the diodes fail in either the shorted or open state, the system will continue to operate. However, If subsequently, a battery plant or another diode were to fail, then depending on which diode had failed in which state, the system can fail. For example, if diode 11 fails in the open state, and battery plant 2 fails, then battery plant 1 cannot provide power on the positive side of Power Converter 30. If diode 11 failed shorted, and battery plant 1 fails, the entire load connected to battery plant 1 would be sourced through diode 11, causing an overload. These are called "silent failures" because it is impossible to detect their presence without performing operations (such as a trial disconnect of a feeder), that potentially lead to system outages.

A problem of the prior art, therefore, is that silent failures by the diodes connecting the battery supplies to the power converters are not detected until it is too late.

Solution

The above problem is solved, and an advance is made over the teachings of the prior art in accordance with Applicants' invention, wherein the voltage drop across each diode is measured and analyzed. A shorted diode will be detected if the voltage drop across, for example, a silicon diode goes from approximately 0.7 volts to approximately zero. In order to detect an open diode, a power resistor in close proximity to a diode and thermally connected only to that diode, is connected to a source of power in order to heat up the diode. This increases the voltage drop across a good diode, and for well regulated battery plants, increases it sufficiently so that if the diode serving the other feed is not now functioning because it has failed in the open state, the voltage drop measured across the open diode will continue to rise well above the expected 0.7 volt level. Once this voltage drop exceeds a threshold, an alarm is triggered. Similarly, if the change in voltage of the two corresponding diodes tracks exactly, the diode that is not being heated is probably open. Advantageously, this arrangement allows silent failures to be detected immediately, and thus, subsequent major failures can be avoided.

BRIEF DESCRIPTION OF THE DRAWING(S)

DETAILED DESCRIPTION

Figure 1:
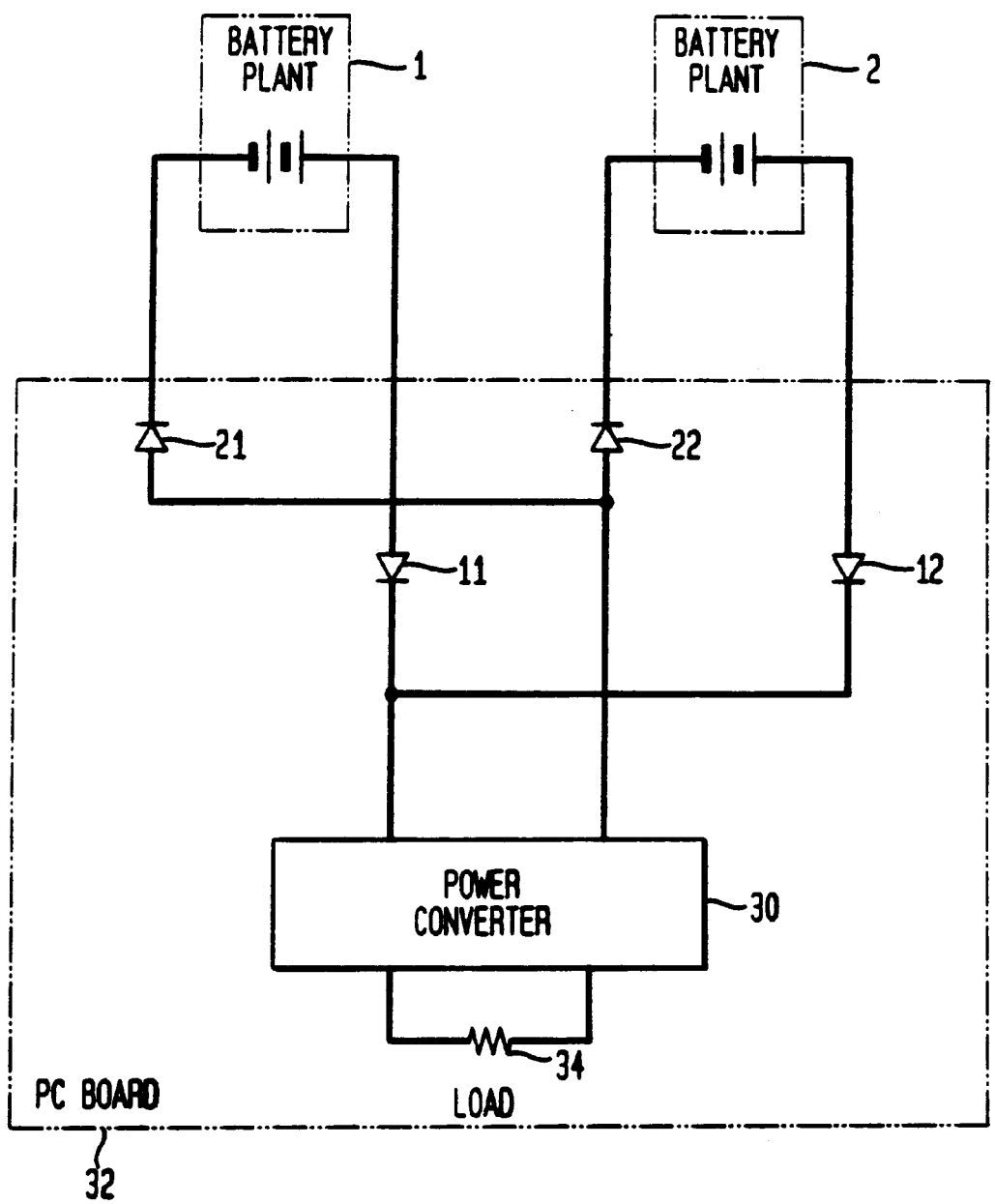
FIG. 1 illustrates the prior art.

A pair of battery plants, 1 and 2, are connected to a power converter 30 on for example, a PC Board 32, containing a load represented by load symbol 34. The power converter is connected on its positive input side by diodes 11 and 12 to the two battery plants, and is connected on its negative input side by diodes 21 and 22 to the two battery plants. In this system, a silent failure of any of the four diodes in either the open or shorted state will leave the power conversion system vulnerable to a failure of a power supply or a second diode. For example, if one diode fails in the open state, then if the corresponding diode connected to the other battery plant also fails in the open state, no power can be fed from one of the two directions to the power converter. Further, if diode 21, for example, were to fail in the open state, and battery plant 2 failed, the power converter could not receive its negative input. If diode 21 failed in its shorted state, then a failure of battery plant 1 would cause an excessive drain on battery plant 2, and would, therefore, shut down power to the power converter 30.

Figure 2:
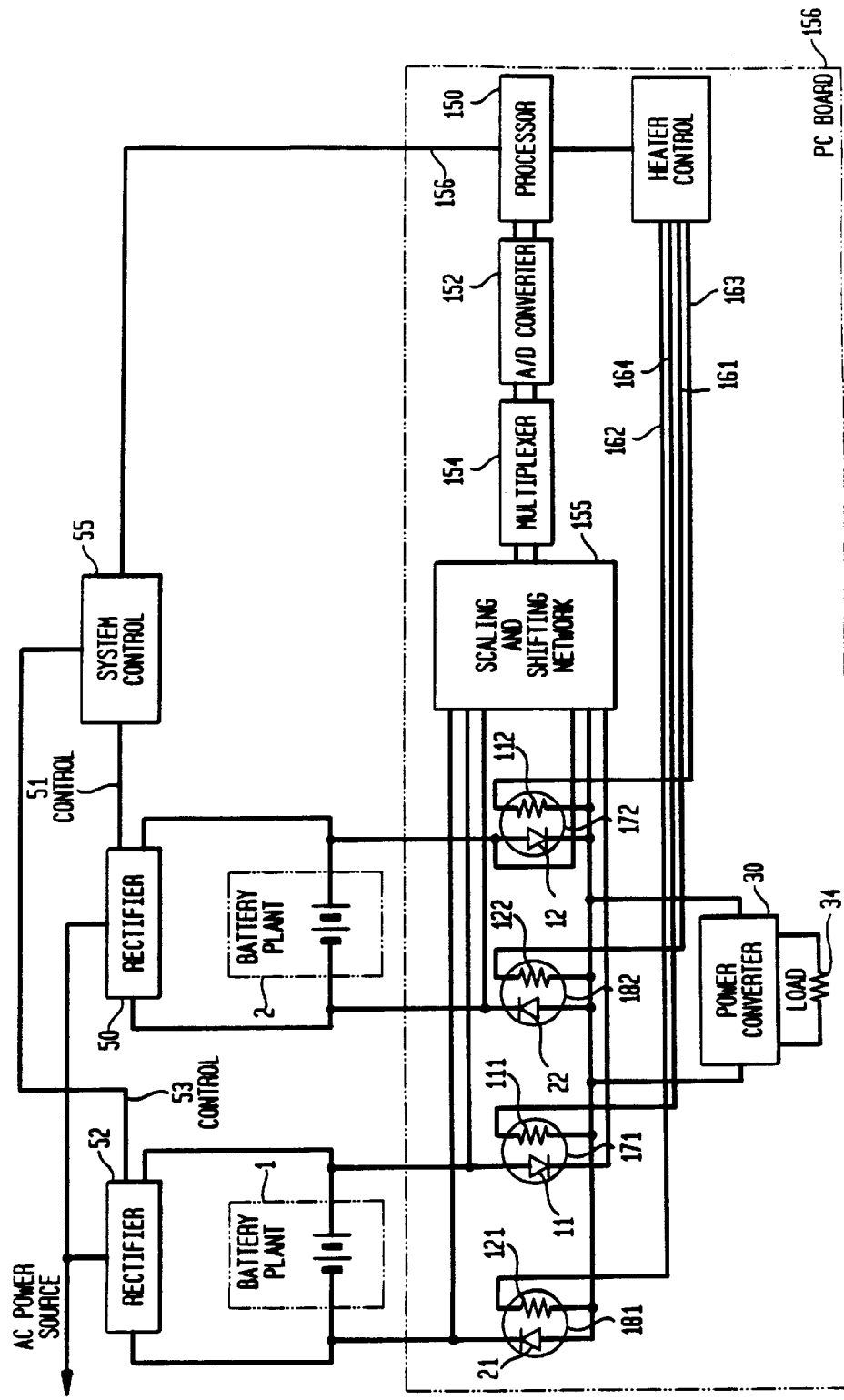
FIG. 2 illustrates the principles of Applicants' invention.

In order to overcome these problems, the system of FIG. 2 is used in accordance with the principles of Applicants' invention. The same battery plants, and the same four diodes are shown in FIG. 2. What has been added is a Processor System 150 connected by a Multiplexer 154, and a scaling and level shifting network 155 for accessing the two sides of each diode, and an Analog Digital Converter 152 in order to measure the voltage across each diode. In addition, 4 power resistors 111, 112, 121, and 122, are placed in close thermal contact with diodes 11, 12, 21, and 22, respectively. Diode and power resistor assemblies 171 (Diode 11, Resistor 111), 172 (Diode 12 and Resistor 112), 181 (Diode 21, Resistor 121), and 182 (Diode 22 and Resistor 122) are on individual heat sinks, all thermally insulated from each other, and from large external heat sinks. When a power system test is desired, an initiate test signal is asserted, the drops across all four diodes are measured, and if any are below a threshold, that diode is shorted. The voltage across these power resistors is controlled by heater control 160 such that if a positive voltage is applied on one of the leads 161, 162, 163, or 164, one of the power resistors 111, 112, 121, or 122, respectively, is heated and the diode next to that power resistor is also heated. As is well known, when a diode is heated, the voltage across that diode in the conducting state increases. If the battery plants 1 and 2 track each other sufficiently, then the increased voltage across the heated diode will cause a shift in the load from one of the battery plants to the other. Further, this higher voltage will only occur if the diode is neither open nor shorted. The voltages across each of the four diodes are measured, and the absence of a change in the voltage across a diode being heated or its corresponding member of the pair not heated, will indicate that this diode is defective.

In order to detect an open in diode 21, diode 22 is heated by applying power to resistor 122, and waiting for a sufficient time for assembly 182 to heat up. If, because of temporary slight differences between the voltages of battery plants 1 and 2, most of the load current was originally flowing through diode 22 as diode 22 heats up, its forward drop is increased and will eventually cause the majority of the load current to transfer to diode 21. As diode 22 continues to become warmer, its forward drop will continue to rise, and diode 21 will maintain a 0.7 volt drop. Power to resistor 122 is removed and sufficient time is allowed for assembly 182 to cool down. By repeating this process for the remaining 3 diode/resistor assemblies, all four diodes can be diagnosed regardless of the small differences in battery plant voltages. According with this arrangement, "silent" failures of the diodes connecting the power converter to the battery plant can be detected and alarmed so that the diodes can be replaced before a major failure occurs. In an alternative embodiment, one processor system can be used for detecting troubles in a plurality of power diode systems. Advantageously, this saves the cost of a plurality of processor systems. If after completing the full series of tests no faults are detected, processor 150 generates a power good signal sent over connection 156 to an office control system 55. If any faults are detected, the processor generates a power alarm 158. The process is started by a control signal over the connection 156 from the office control sytem 55. Office control system 55 communicates with processor 150 to initiate tests and to receive indications of success or failure (alarm).

In a alternative embodiment, the rectifier 50 with control input 51 is used as a mechanism for slowly reducing the voltage of battery plant 2. This causes diodes 11 and 21 to conduct even if battery plant 1 is normally at a slightly higher voltage than battery plant 2. Then a true forward voltage drop can be measured for these diodes so that if they were open, the condition would be detected. The same process is repeated at a later time with rectifier 52 and control input 53. No power resistors or heater controls are required in this embodiment. Office control system 55 manages the sequence of reducing the voltage of the battery plants and initiating the test request to all the PC board control processors 150 at appropriate times.

The above description is of one preferred embodiment of Applicants' invention. Many other embodiments will be apparent to those of ordinary skill in the art. The invention is only limited by the attached claims.

What is claimed is:

1. Apparatus for providing a reliable power supply, comprising:

a pair of DC power sources and diodes connecting each of said power sources to a power converter;

characterized in that said system further comprises access means and processor means for measuring the voltage on both sides of each of said diodes;

wherein the measured voltages are analyzed by said processor means in order to detect open or shorted diodes;

further comprising:

a plurality of power resistors, each in close proximity and in thermal contact with one of said diodes; and means for applying power selectively to each of said power resistors;

wherein said processor means further analyzes the changes in voltage across said diodes when power is applied to a power resistor in close proximity to one of said plurality of diodes;

wherein the voltage measurements across said diodes further reveal information about incipient or actual diode failures.

2. The apparatus of claim 1, further comprising power good and power alarm outputs whose states are determined by the results of the diode voltage drop measurements.

* * * * *